United States Patent
Assefa et al.

(10) Patent No.: US 7,492,631 B1
(45) Date of Patent: Feb. 17, 2009

(54) METHODS INVOLVING RESETTING SPIN-TORQUE MAGNETIC RANDOM ACCESS MEMORY

(75) Inventors: Solomon Assefa, Ossining, NY (US); William J. Gallagher, Ardsley, NY (US); Chung H. Lam, Peekskill, NY (US); Jonathan Z. Sun, Shrub Oak, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/118,496

(22) Filed: May 9, 2008

(51) Int. Cl.
    *G11C 11/14* (2006.01)
(52) U.S. Cl. .................. 365/171; 365/158; 365/173
(58) Field of Classification Search .............. 365/171, 365/173, 158
    See application file for complete search history.

(56) References Cited

U.S. PATENT DOCUMENTS 7,110,284 B2    9/2006  Hayakawa et al.
7,190,611 B2 *  3/2007  Nguyen et al. .............. 365/158

\* cited by examiner

*Primary Examiner*—Huan Hoang
(74) *Attorney, Agent, or Firm*—Cantor Colburn LLP; Vazken Alexanian

(57) ABSTRACT

An exemplary method for resetting a spin-transfer based random access memory system, the method comprising, inducing a first current through a conductor, wherein the first current is operative to change a direction of orientation of a magnetic reference layer, inducing a second current from the drain terminal to the write terminal via a conductive layer, wherein the second current is operative to change the direction of a magnetic state of a free layer magnet, and inducing a third current through the conductor, wherein the third current is operative to change the direction of magnetic orientation of the reference layer.

1 Claim, 8 Drawing Sheets

METHODS INVOLVING RESETTING SPIN-TORQUE MAGNETIC RANDOM ACCESS MEMORY

CROSS REFERENCE TO RELATED APPLICATIONS

The present application is co-pending with the concurrently filed applications, entitled "SYSTEMS INVOLVING SPIN-TRANSFER MAGNETIC RANDOM ACCESS MEMORY," and "METHODS INVOLVING RESETTING SPIN-TORQUE MAGNETIC RANDOM ACCESS MEMORY WITH DOMAIN WALL" assigned to the assignee of the present application, the contents of which are incorporated herein by reference in their entirety.

BACKGROUND OF THE INVENTION

1. Field of the Invention

This invention relates generally to magnetic random access memory and specifically to methods involving resetting spin-torque based magnetic random access memory.

2. Description of Background

A dense, diode-selection based memory architecture has recently been demonstrated for a two-terminal memory device based on phase change materials. However, since spin-RAM usually uses bidirectional current for writing the 0 and 1 states, a dense, diode selection-based memory architecture is difficult to implement with spin-RAM since diodes may limit the use of bidirectional current.

A method for resetting a spin-RAM that avoids the use of bidirectional current is desired.

SUMMARY OF THE INVENTION

The shortcomings of the prior art are overcome and additional advantages are achieved through an exemplary method for resetting a spin-transfer based random access memory system, the method including, inducing a first current through a conductor, wherein the first current is operative to change a direction of orientation of a ferromagnetic film layer, inducing a second current from the drain terminal to the write terminal via a conductive layer, wherein the second current is operative to change the direction of a magnetic state of a free layer magnet, and inducing a third current through the conductor, wherein the third current is operative to change the direction of magnetic orientation of the ferromagnetic film layer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Methods involving resetting spin-torque based magnetic write random access memory are provided. Several exemplary embodiments are described.

The embodiments of a spin-torque based magnetic write random access memory allow for more robust operation of the memory device with existing materials combination. It fuirther enables the implementation of a high-density version of spin-RAM, based on diode-selection that makes spin-RAM more economical to produce. This improves cost-to-performance characteristics, while retaining the basic advantages of a spin-torque-based RAM. The ferromagnetic film layer may be a source for changing a direction of spin injection using a unipolar write current for each bit. The ferromagnetic film layer may be relatively large (in excess of 100 nm) and shared by multiple memory bits.

Figure 2:
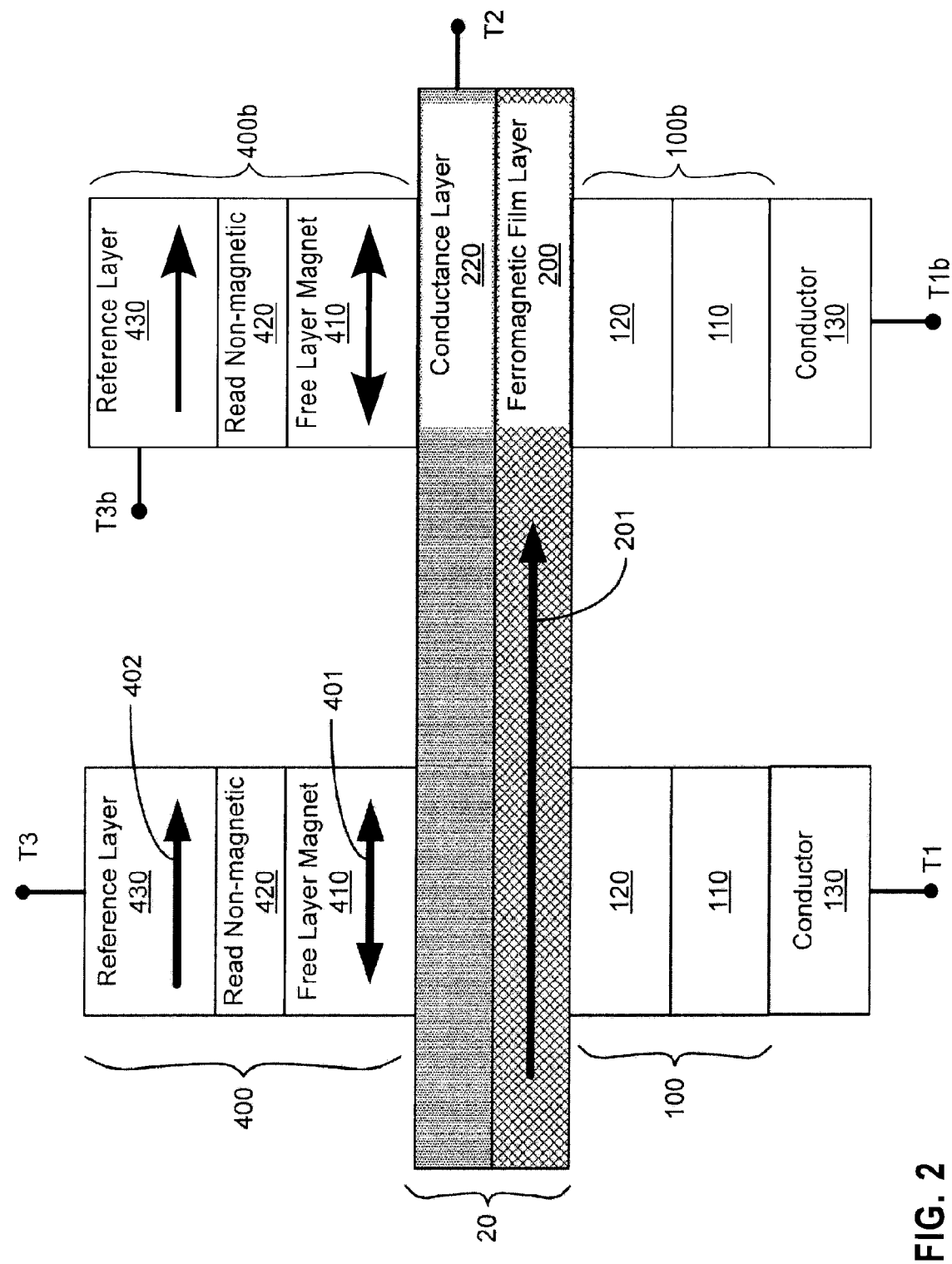
FIG. 2 illustrates a front partially cut-away view of an example of an embodiment of a spin-torque based magnetic write random access memory system.

FIG. 2 illustrates a front partially cut-away view of a three-tenninal spin-torque based magnetic write random access memory containing electrical connections, T1, T2 and T3 terminals. In the illustrated embodiment, a write portion 100 is a pillar-shaped non-linear selection device, such as, for example, a P/N junction that includes a p-type doped region 110 and an n-type doped region 120 (or in reverse order, depending on the direction of write current for the design). The n-type doped region 120 electrically contacts a ferromagnetic film layer 200. The p-type doped region 110 electrically contacts a conductor 130 that is connected to theT1 terminal. Though the illustrated embodiment shows a P/N junction, any suitable non-linear selection device may be used for the write portion 100. FIG. 2 also includes a second read portion 400b having a terminal T3b and a second write portion 100b having a terminal T1b.

Though FIG. 2 illustrates two read portions and write portions. The methods described above may be used to reset the memories of embodiments having any additional number of read portions and write portions similar to read portion 400 and write portion 100.

A spin-current generating portion 20 includes the ferromagnetic film layer 200, and a conductance layer 220. The ferromagnetic film layer 200 is a magnetic, spin-polarizing layer. The conductance layer 220 is a non-magnetic, spin preserving, high conductance layer such as, for example, copper. A tunnel layer (not shown) may be used to separate the ferromagnetic film layer 200 and the conductance layer 220. Depending on the specifics of materials properties, the tunnel layer may not be necessary. In some materials combinations, it is possible to allow a direct, high quality interface (usually formed during thin film deposition) between the ferromagnetic film layer 200 and the conductance layer 220. The conductance layer 220 electrically contacts the T2 terminal.

A read portion 400 forms the magnetic state detection device group. The read portion 400 is a pillar shape on the conductance layer 220. The read portion 400 includes a free layer magnet 410 disposed on the conductance layer 220, a read non-magnetic layer 420, and a reference layer 430. The read non-magnetic layer 420 is a non-magnetic spin-preserving metallic separation layer that may be, for example, a tunnel barrier layer. The reference layer 430 electrically contacts the T3 terminal. The read portion 400 is disposed on the conductance layer 220 with a high quality interface, usually formed during film growth, to allow efficient interaction between the free layer magnet 410 and a spin-current (not shown).

Figure 3:
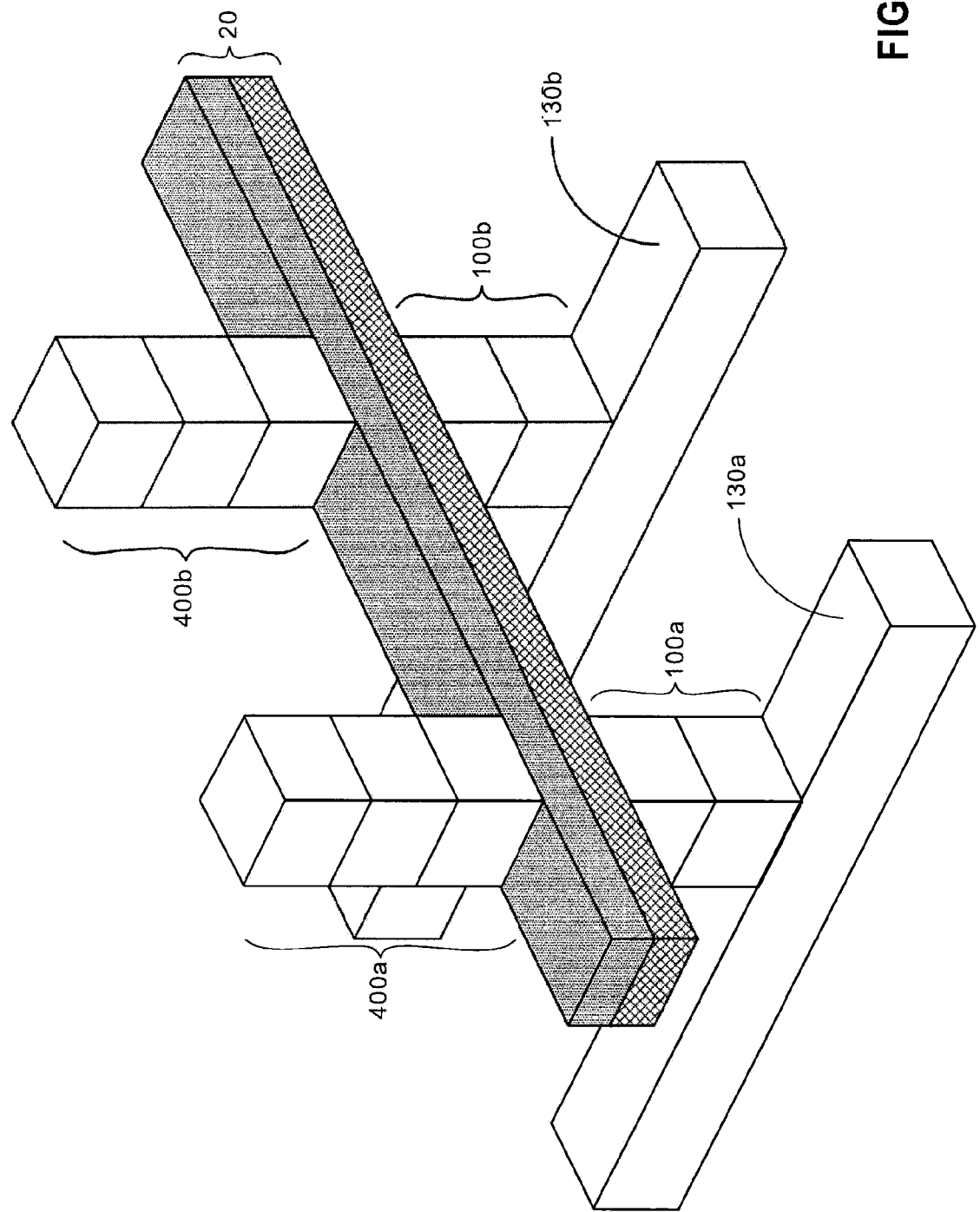
FIG. 3 illustrates a perspective view the example of the embodiment of the spin-torque based magnetic write random access memory system of FIG. 2.

The reference layer 430 is magnetically fixed. A direction of magnetization of the reference layer 430 is permanently fixed in the direction indicated by the arrow 402. In the illustrated embodiment, the arrow 402 points to the right, however, the arrow 402 may point to the left in other embodiments. The free layer magnet 410 is a nanomagnet having a magnetic state illustrated by the arrow 401. The free layer magnet 410 serves as a memory element and the direction of the arrow 401 (right or left) indicates two bi-stable memory states of the free layer magnet 410. FIG. 3 illustrates a perspective view of the three-terminal spin-torque based magnetic write random access memory of FIG. 2.

Figure 1:
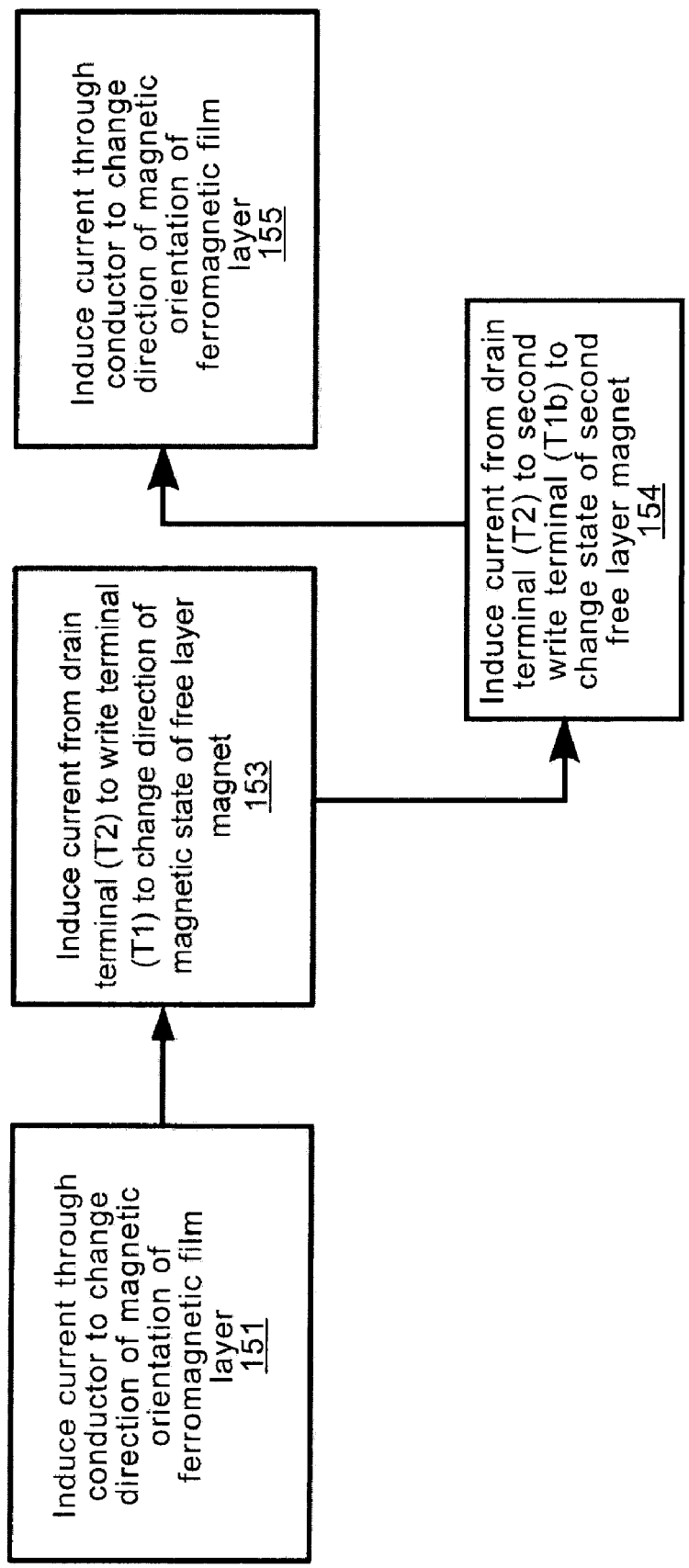
FIG. 1 illustrates a block diagram of an exemplary method for resetting a three terminal spin-RAM device.

FIG. 1 illustrates a block diagram of an exemplary method of resetting a spin-torque-based RAM. Referring to block 151, a first current is induced through a conductor to change a direction of magnetic orientation of a ferromagnetic film layer. In block 153, a second current is induced from a drain terminal to a write terminal that changes the magnetic state of a free layer magnet. In block 154, a third current is induced from the drain terminal to a second write terminal that changes the magnetic state of a second free layer magnet. In block 155, a fourth current is induced through the conductor to change the direction of magnetic orientation of the ferromagnetic film layer. The method illustrated in FIG. 1 is shown in detail in FIGS. 4-7.

Figure 4:
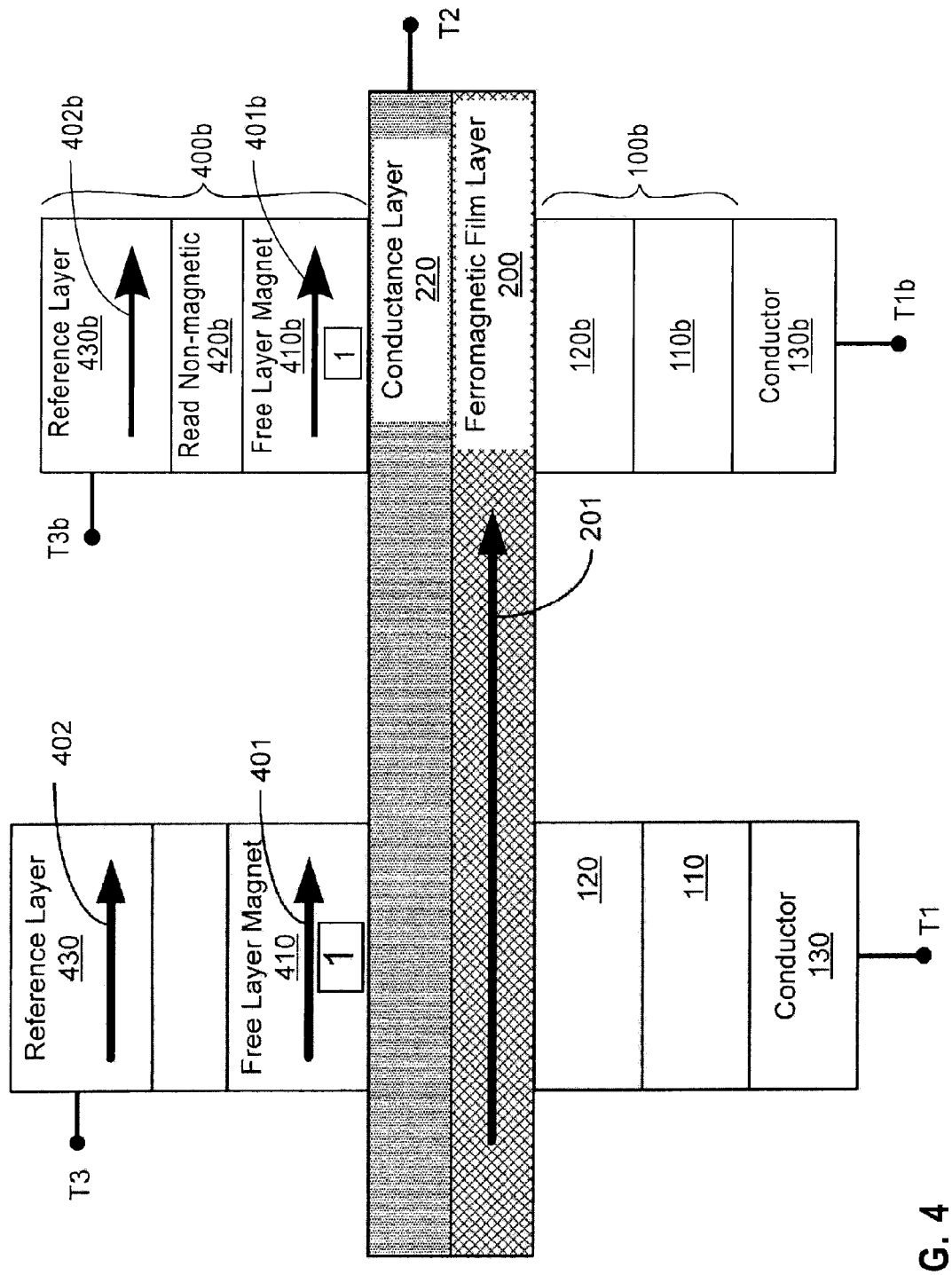
FIGS. 4-8 illustrate a side-view of an example of an embodiment of a spin-torque based magnetic write random access memory system and the method described in FIG. 1.

FIG. 4 shows an embodiment of a spin-torque-based RAM similar to the embodiment of FIG. 2. In FIG. 4, the magnetization of the reference layers 430 and 430b are permanently fixed in the direction indicated by the arrows 402 and 402b. The magnetic orientation of the free layer magnets 410 and 410b, memory elements, are shown by the arrows 401 and 401b. In the illustrated embodiment the arrows 401 and 401b are pointed to the right, representing 1 bits. The direction magnetic orientation of the ferromagnetic film layer 200 is represented by the arrow 201.

Figure 5:
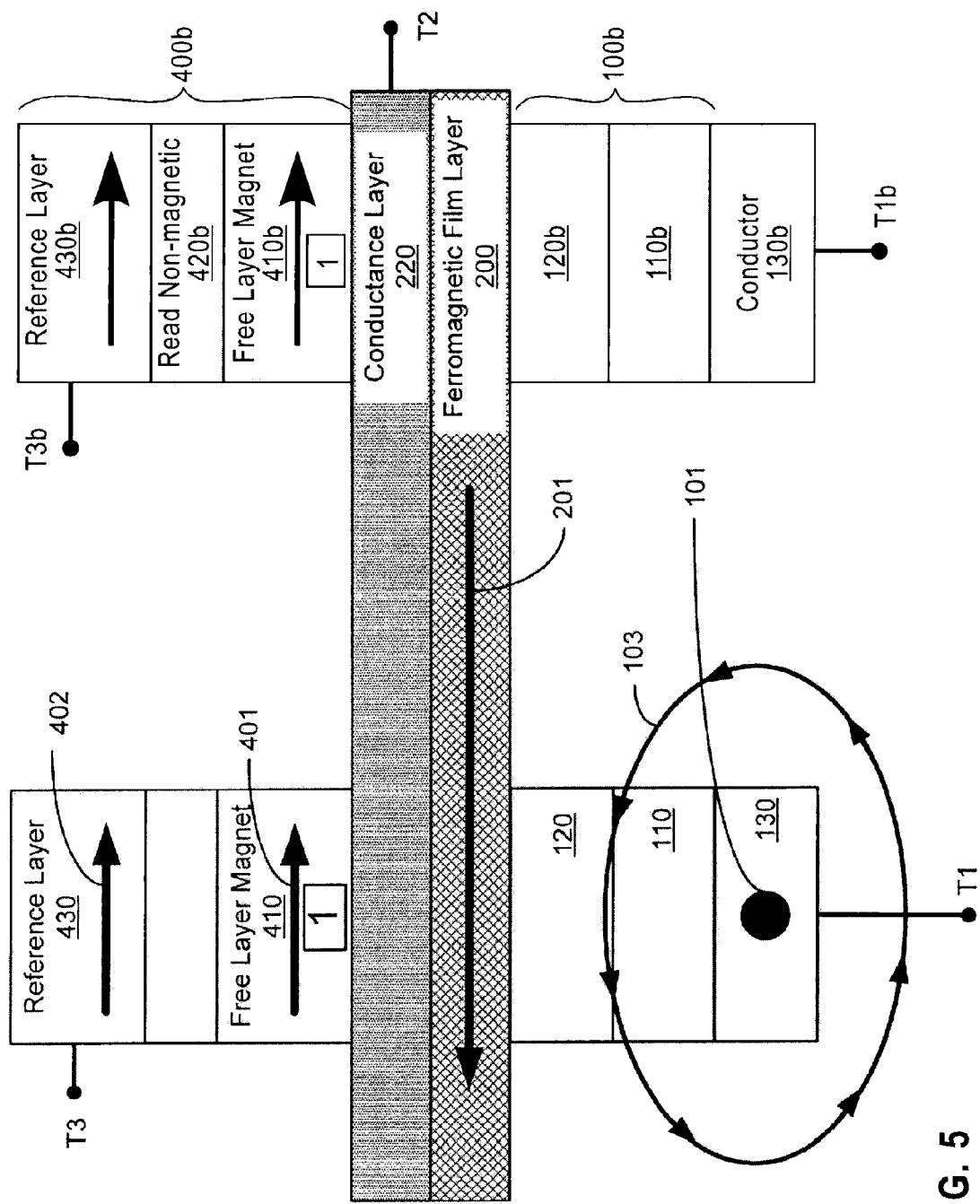

To change the free layer magnets 410 and 410b from representing 1 bits to 0 bits, the direction of the magnetic orientation of the ferromagnetic film layer 200 is first reversed. FIG. 5 illustrates a method of reversing the direction of the magnetic orientation of the ferromagnetic film layer 200. As illustrated in block 151 (of FIG. 1), a first current 101 is induced along the conductor 130. The conductor 130 is orientated at a right angle to the ferromagnetic film layer 200. The first current 101 creates a magnetic flux 103 that is effective to change the direction of the magnetic orientation of the ferromagnetic film layer 200 to an opposite direction as indicated by the arrow 201

Figure 6:
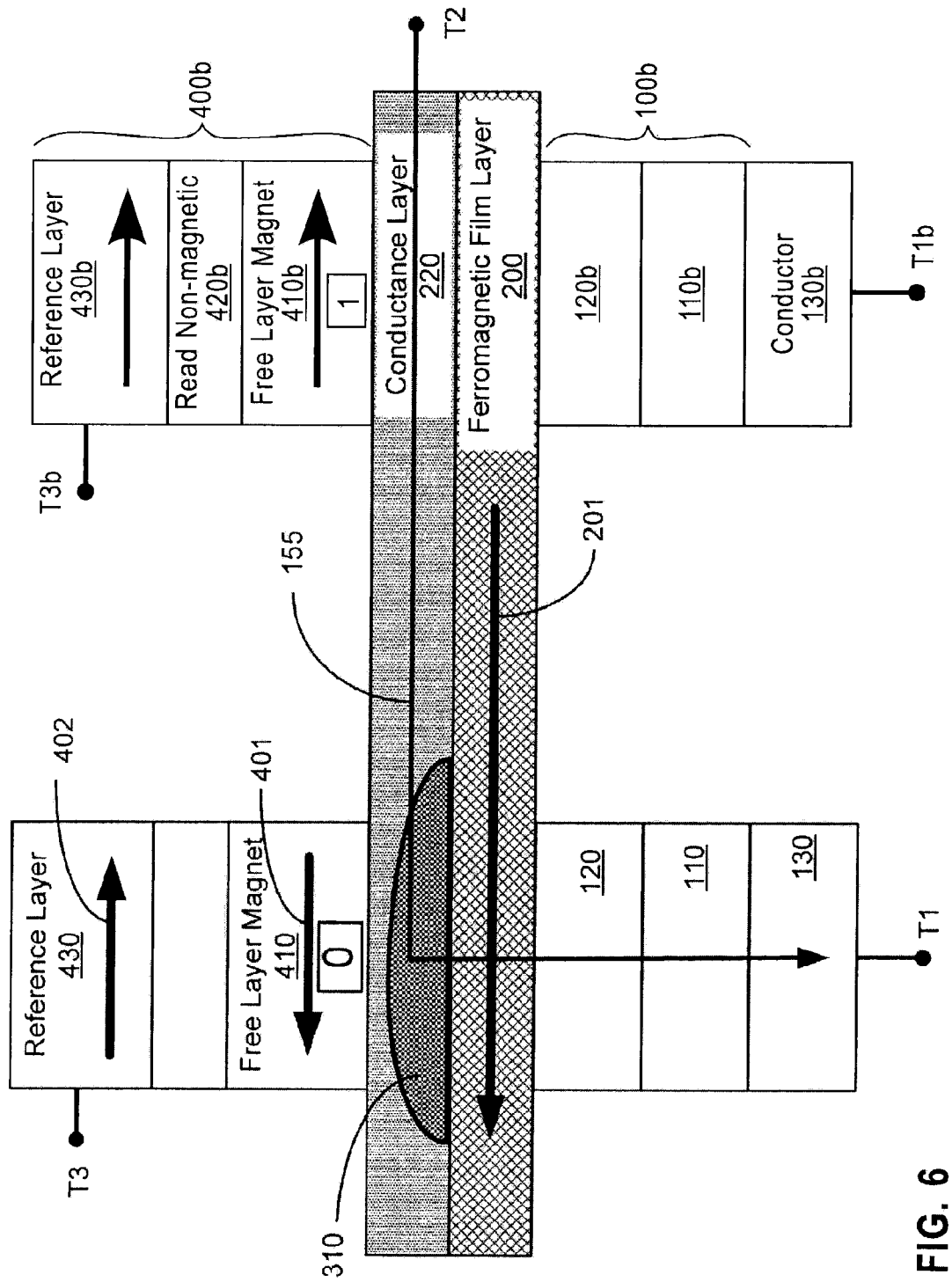

Referring to FIG. 6, once the direction of the magnetic orientation of the ferromagnetic film layer 200 is changed, the free layer magnet 410 may be changed from representing a 1 bit to a 0 bit. As illustrated in block 153 (of FIG. 1), a second current 155 is induced between the T2 terminal and the T1 terminal. The second current 155 and the direction of the magnetic orientation of the ferromagnetic film layer 200 result in a spin accumulation. A spin accumulation is a non-equilibrium spin state with conduction electrons having a significant amount of excess spin in the direction defined by the magnetic orientation of the ferromagnetic film layer 200 and the direction of the second current 155. The region having a spin accumulation is illustrated as region 310. The spin accumulation of region 310 results in a change in the direction of the magnetic state of the free layer magnet 410 as indicated by the arrow 401. The direction of the arrow 401 now represents a 0 bit.

Figure 7:
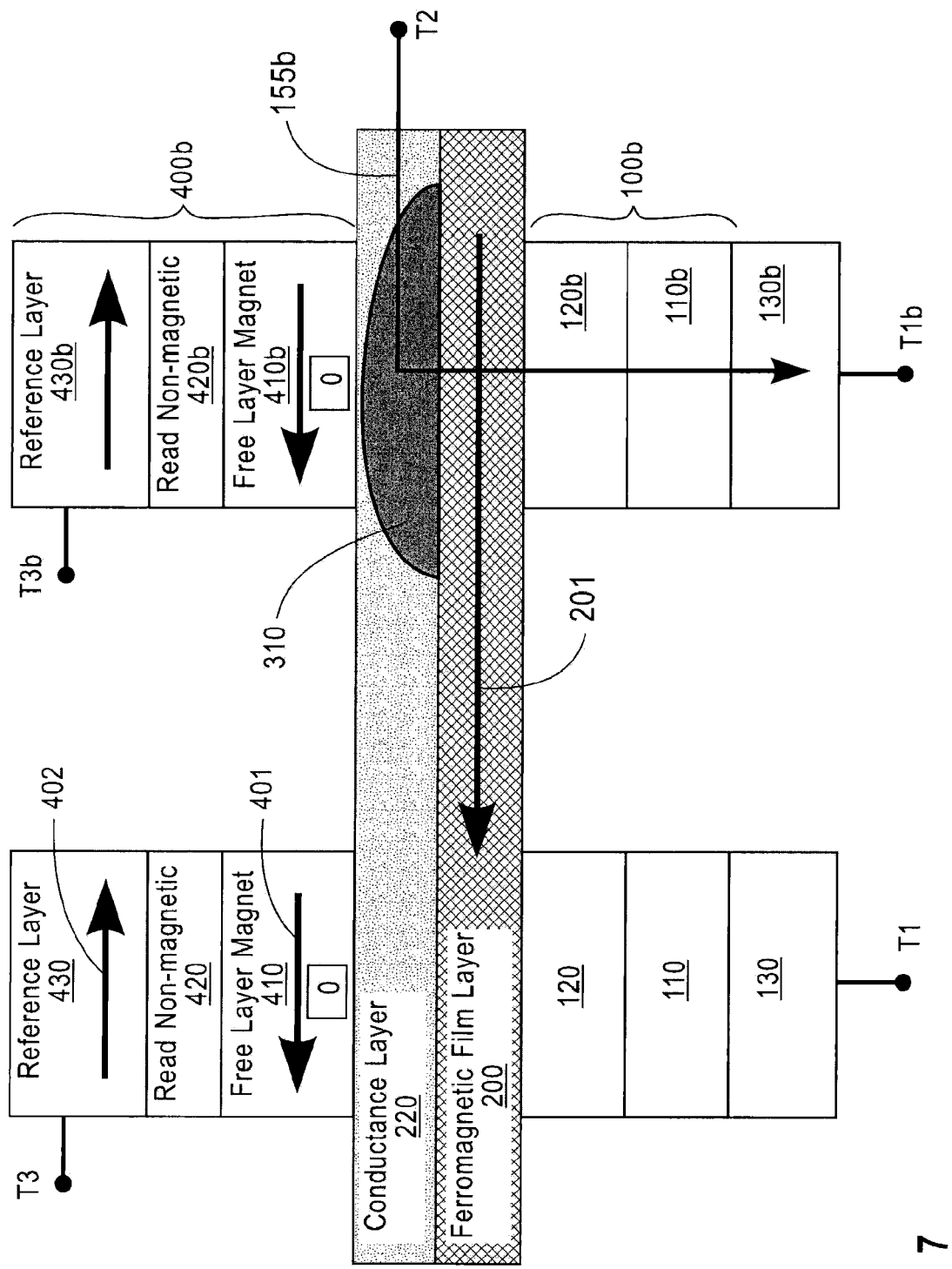

FIG. 7 illustrates block 154 (of FIG. 1). After the direction of the magnetic state of the free layer magnet 410 is changed, the direction of the magnetic state of the free layer magnet 410 may be changed in a similar manner. A third current 155b is induced between the T2 terminal and the T1b terminal resulting in a spin accumulation in a region 130b. The spin accumulation of region 310b results in a change in the direction of the magnetic state of the free layer magnet 410b as indicated by the arrow 401b. The direction of the arrow 401b now represents a 0 bit.

Figure 8:
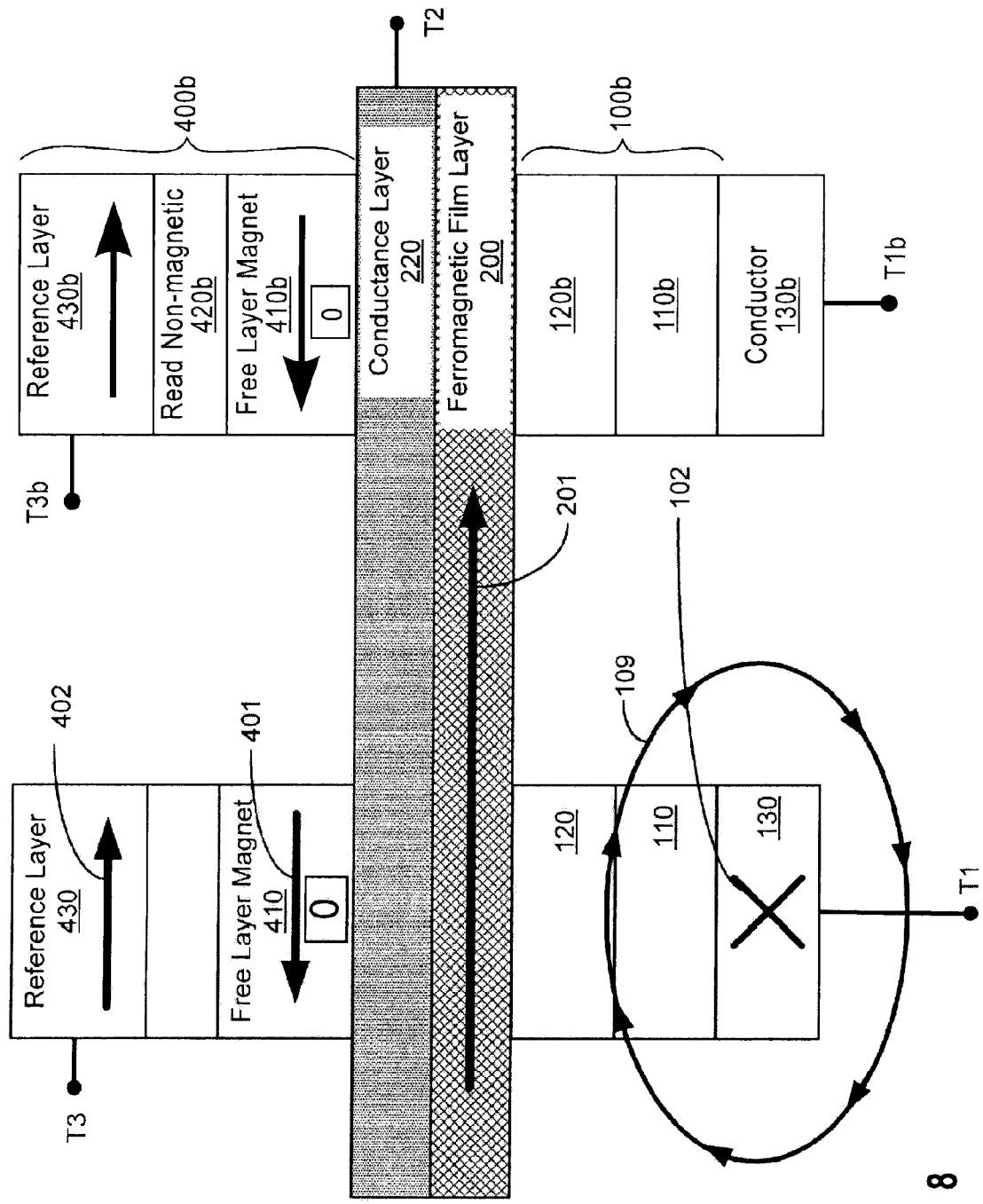

FIG. 8 illustrates block 155 (of FIG. 1). After the direction of the magnetic state of the free layer magnets 410 and 410b are changed, the direction of the magnetic orientation of the ferromagnetic film layer 200 may be returned to the first direction shown in FIG. 5 by arrow 201. A fourth current 102 is induced along the conductor 130 in a direction opposite to the first current 101. The fourth current 102 creates a magnetic flux 109 that is effective to change the direction of the magnetic orientation of the ferromagnetic film layer 200 to an opposite direction as indicated by the arrow 201.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for resetting a spin-transfer based random access memory system, the method comprising:
   inducing a first current through a conductor, wherein the first current is operative to change a direction of orientation of a ferromagnetic film layer;
   inducing a second current from a drain terminal to a first write terminal via a conductance layer, wherein the second current is operative to change the direction of a magnetic state of a free layer magnet; and
   inducing a third current from the drain terminal to a second write terminal via the conductance layer, wherein the third current is operative to change the direction of a magnetic state of a free layer magnet; and
   inducing a fourth current through the conductor, wherein the fourth current is operative to change the direction of magnetic orientation of the ferromagnetic film layer.

* * * * *